United States Patent
Kang et al.

(10) Patent No.: US 12,119,225 B2
(45) Date of Patent: Oct. 15, 2024

(54) OXIDE SEMICONDUCTOR SPUTTERING TARGET AND METHOD OF FABRICATING THIN-FILM TRANSISTOR USING SAME

(71) Applicant: KV Materials Co., Ltd., Gyeongbuk (KR)

(72) Inventors: Shinhyuk Kang, Seoul (KR); Jeonghyun Moon, Daegu (KR); Kangmin Ok, Gyeongsangbuk-do (KR)

(73) Assignee: KV Materials Co., Ltd. (KR)

( * ) Notice: Subject to any disclaimer, the term of this patent is extended or adjusted under 35 U.S.C. 154(b) by 135 days.

(21) Appl. No.: 17/841,270

(22) Filed: Jun. 15, 2022

(65) Prior Publication Data
US 2022/0415654 A1    Dec. 29, 2022

(30) Foreign Application Priority Data
Jun. 23, 2021    (KR) .................. 10-2021-0081335

(51) Int. Cl.
| | |
|---|---|
| H01L 21/02 | (2006.01) |
| C23C 14/34 | (2006.01) |
| H01J 37/34 | (2006.01) |
| H01L 29/786 | (2006.01) |

(52) U.S. Cl.
CPC .... *H01L 21/02631* (2013.01); *C23C 14/3414* (2013.01); *H01J 37/3426* (2013.01); *H01L 21/02565* (2013.01); *H01L 29/7869* (2013.01); *C23C 14/3407* (2013.01)

(58) Field of Classification Search
None
See application file for complete search history.

(56) References Cited

U.S. PATENT DOCUMENTS

| | | | | |
|---|---|---|---|---|
| 2004/0180217 A1* | 9/2004 | Inoue | ................ | C04B 35/62685 204/192.18 |
| 2012/0118726 A1* | 5/2012 | Yano | ................... | H01L 29/7869 264/681 |

* cited by examiner

*Primary Examiner* — Jason Berman
(74) *Attorney, Agent, or Firm* — Lerner David LLP (57) ABSTRACT

An oxide semiconductor sputtering target used in a sputtering process to deposit an active layer of a TFT. The oxide semiconductor sputtering target is formed from a material based on a composition of In, Sn, Ga, Zn, and O. The material contains gallium oxide, tin oxide, zinc oxide, and indium oxide. The In, Sn, Ga, and Zn contents are in ranges of 60% to 80%, 0.5% to 8%, 5% to 15%, and 10% to 30% by weight with respect to the weight of In+Sn+Ga+Zn, respectively. A method of fabricating a TFT includes depositing an active layer using the oxide semiconductor sputtering target. Such a TFT is used in a liquid crystal display (LCD), an organic light-emitting display, an electroluminescence display, and the like.

12 Claims, 7 Drawing Sheets

| No. | In (wt%) | Conductor | Semiconductor unsuitable for use as active layer | Semiconductor |
|---|---|---|---|---|
| 1 | 42.1 | | ○ | |
| 2 | 48.5 | | ○ | |
| 3 | 59.9 | | ○ | |
| 4 | 62.7 | | | ○ |
| 5 | 65.6 | | | ○ |
| 6 | 66.5 | | | ○ |
| 7 | 70.6 | | | ○ |
| 8 | 70.7 | | | ○ |
| 9 | 70.8 | | | ○ |
| 10 | 70.8 | | | ○ |
| 11 | 70.9 | | | ○ |
| 12 | 70.9 | | | ○ |
| 13 | 71.1 | | | ○ |
| 14 | 71.4 | | | ○ |
| 15 | 71.6 | | | ○ |
| 16 | 72.8 | | | ○ |
| 17 | 78.6 | | | ○ |
| 18 | 81.2 | | ○ | |
| 19 | 84.1 | ○ | | |
| 20 | 90.2 | ○ | | |

OXIDE SEMICONDUCTOR SPUTTERING TARGET AND METHOD OF FABRICATING THIN-FILM TRANSISTOR USING SAME

CROSS-REFERENCE TO RELATED APPLICATIONS

The present application claims benefit of priority to Korean Patent Application No. 10-2021-0081335, filed Jun. 23, 2021, and is assigned to the same assignee as the present application and is incorporated herein by reference.

FIELD

The present disclosure relates, generally, to an oxide semiconductor sputtering target and a method of fabricating thin-film transistors (TFTs) using the same and, more particularly, to an oxide semiconductor sputtering target and a method of fabricating a TFT using the same, by which a thin film having high electron mobility and high reliability in driving a device can be deposited.

BACKGROUND

Although thin-film transistors (TFTs) are used in SRAM or ROM, they are mainly used as switching devices for pixels of an active matrix flat panel display. For example, TFTs are used as switching devices or current driving devices in a liquid crystal display (LCD) or an organic electroluminescence display. Here, TFTs used as switching devices serve to independently control respective pixels, so that respective pixels may express different electric signals.

Currently, an LCD or an organic light-emitting display generally uses TFTs having a Si-based active layer. However, amorphous Si used in displays has limitations in realizing displays having high resolution/high speed driving performance, due to low operating speed and instability characteristics caused by low electron mobility of about 0.5 cm2/Vs. In addition, poly-Si generally used in organic electroluminescence displays is crystallized using an excimer laser, and thus the performance thereof, such as TFT device characteristics including electron mobility, is advantageously superior to that of amorphous Si. However, there is a drawback in that a large area display cannot be fabricated from poly-Si.

Recently, as a solution, TFTs having an active layer based on an indium-gallium-zinc oxide are also being used as driving devices of display devices. However, such TFTs have limitations in being used in next-generation displays having large area, high resolution, and high speed driving characteristics, since the electron mobility thereof is lower than that of poly-Si TFTs.

In addition, an active layer based on an oxide having a high In content has also been developed in order to improve mobility. However, when the In content is high, TFTs may have non-uniform characteristics such as mobility, due to non-uniform temperature distribution that may occur in post heat treatment. Thus, the active layer method has limitations in being used in 8th or higher generation large area substrates.

SUMMARY

Various aspects of the present disclosure provide an oxide semiconductor sputtering target and a method of fabricating a thin-film transistor (TFT) using the same, by which a thin film having high electron mobility and high reliability in driving a device can be deposited, and a large area display having high uniformity can be obtained.

In this regard, provided is an oxide semiconductor sputtering target used in a sputtering process to deposit an active layer of a TFT. The oxide semiconductor sputtering target may be formed from a material based on a composition of In, Sn, Ga, Zn, and O.

In some embodiments, the material may contain gallium oxide, tin oxide, zinc oxide, and indium oxide, wherein In, Sn, Ga, and Zn contents are in ranges of 60% to 80%, 0.5% to 8%, 5% to 15%, and 10% to 30% by weight with respect to the weight of In+Sn+Ga+Zn, respectively.

Also provided is a method of fabricating a TFT, the method including depositing an active layer using the oxide semiconductor sputtering target. Such a TFT may be used, for example, in a liquid crystal display (LCD), an organic light-emitting display, an electroluminescence display, and the like.

According to the present disclosure, a target is formed from a quinary semiconductor material based on a composition of In, Sn, Ga, Zn, and O, and an active layer of a TFT is deposited using the target. The active layer according to the present disclosure can have electron mobility and reliability in driving a device superior to those of a related-art active layer formed from a quaternary semiconductor material based on a composition of In, Ga, Zn, and O. In addition, in the active layer according to the present disclosure, non-uniformity in characteristics according to the temperature of post processing are reduced. Accordingly, the performance of the TFT and the performance of a display device including the TFT can be improved. In fabrication of a large area display device, the uniformity of the TFT can be improved, thereby improving the yield of fabrication.

The methods and apparatuses of the present disclosure have other features and advantages that will be apparent from or that are set forth in greater detail in the accompanying drawings, the disclosures of which are incorporated herein, and in the following Detailed Description, which together serve to explain certain principles of the present disclosure.

DETAILED DESCRIPTION

Hereinafter, an oxide semiconductor sputtering target, a thin-film transistor (TFT) including an active layer deposited using the oxide semiconductor sputtering target, and a display device including the TFT according to embodiments will be described in detail with reference to the accompanying drawings.

In the following description, detailed descriptions of known functions and components will be omitted in the case in which the subject matter of the present disclosure is rendered unclear by the inclusion thereof.

Figure 1:
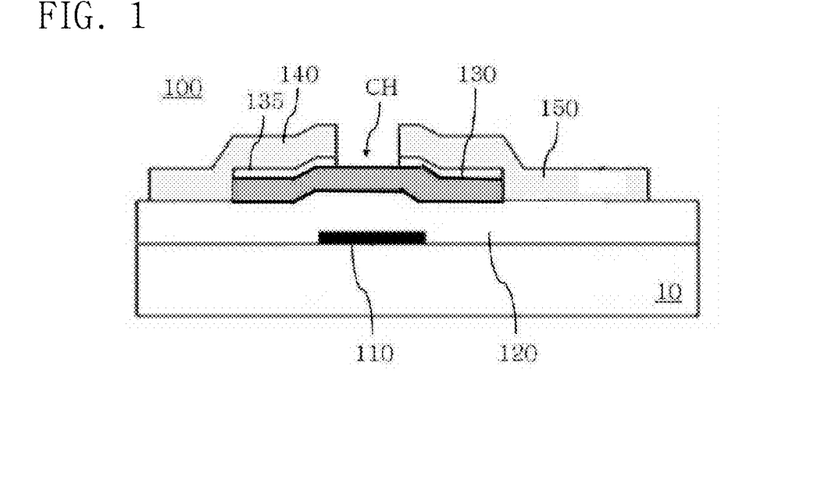
FIG. 1 is a cross-sectional view illustrating a TFT according to an embodiment.

FIG. 1 is a cross-sectional view illustrating a TFT according to an embodiment.

An oxide semiconductor sputtering target according to embodiments is a target used in a sputtering process to deposit an active layer 130 of a TFT 100 as illustrated in FIG. 1. The sputtering is a method of colliding plasma particles against a target and depositing target particles ejected from the target on a substrate placed opposite the target.

In some embodiments, the oxide semiconductor target may be formed from a material based on a composition of In, Sn, Ga, Zn, and O. For example, the oxide semiconductor target may be formed from a gallium oxide, a tin oxide, a zinc oxide, and an indium oxide. Here, an In content, a Sn content, a Ga content, and a Zn content may be in the range of 60% to 80%, 0.5% to 8%, 5% to 15%, and 10% to 30% by weight with respect to the weight of In+Sn+Ga+Zn, respectively. The In, Sn, Ga, and Zn contents may be in ranges of 65% to 75%, 1% to 5%, 7% to 13%, and 10% to 20% by weight with respect to the weight of In+Sn+Ga+Zn, respectively.

Although FIG. 1 illustrates a TFT having a bottom gate structure, the present disclosure is not limited thereto. For example, the sputtering target according to the present disclosure may be used in thin film deposition of TFTs having a variety of structures, such as a top gate structure TFT.

Figure 2:
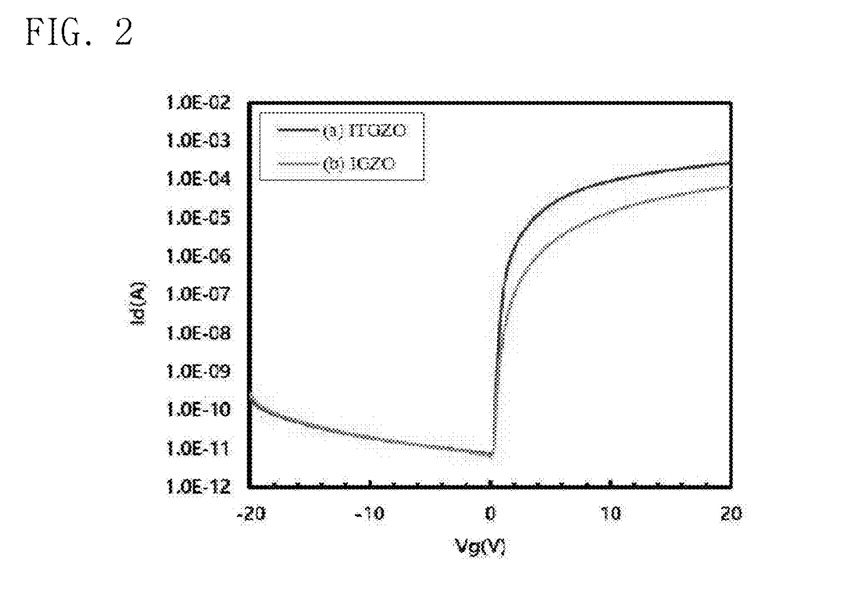
FIG. 2 is a graph illustrating a drain current according to a gate voltage in a TFT according to an embodiment and a TFT of the related art.

FIG. 2 is a graph illustrating drain current according to a gate voltage in a TFT according to an embodiment and a TFT of the related art.

A TFT (a) including an active layer 130 deposited using an oxide semiconductor target formed from a material based on a composition of In, Sn, Ga, Zn, and O was produced by forming the oxide semiconductor target from the material based on the composition of In, Sn, Ga, Zn, and O, and depositing the active layer 130 of the TFT 100 by a sputtering process using the oxide semiconductor target. As illustrated in FIG. 2, when compared to a related-art TFT (b) including an active layer formed from a quaternary semiconductor material based on a composition of In, Ga, Zn, and O, the TFT (a) has a high drain current about 10 times that of the related-art TFT (b) in a high voltage range (Vg>Vth) and thus a high on-off switching ratio. It can also be appreciated that the TFT (a) can exhibit faster switching, since subthreshold swing (V/dec) which is a major characteristic of a switching device, is low.

Figure 3:
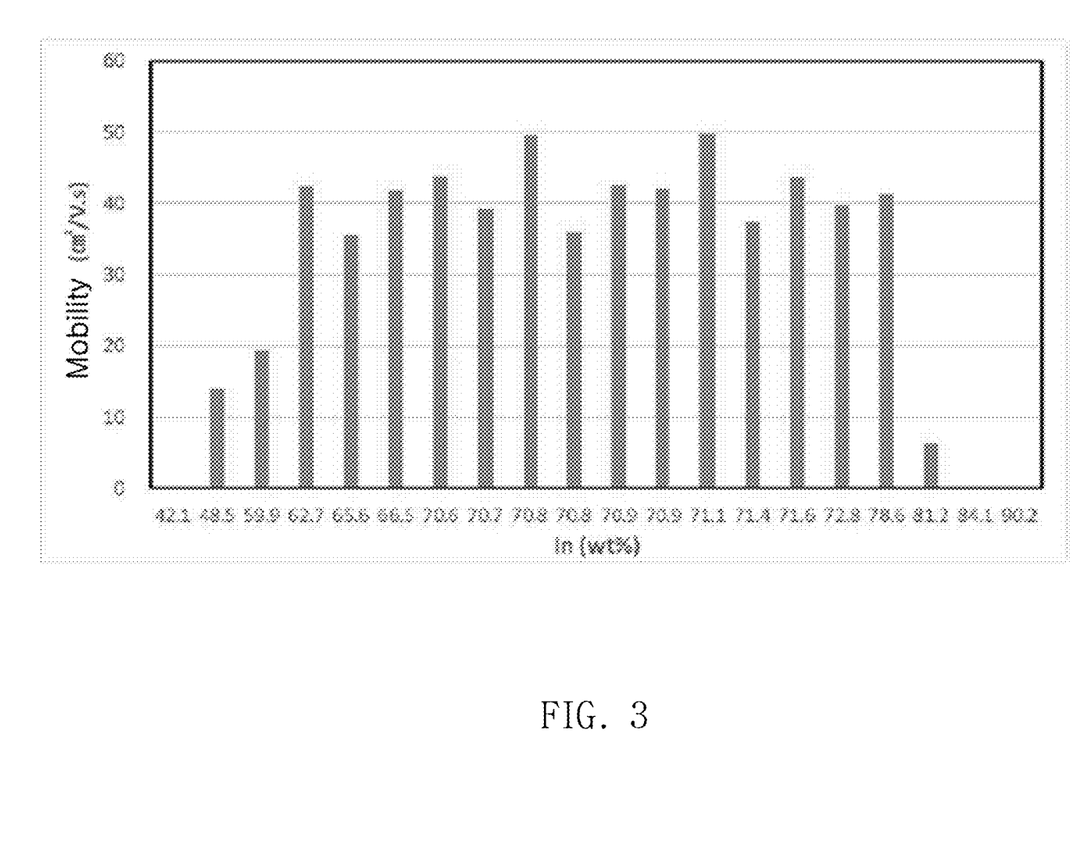
FIG. 3 is a graph illustrating electron mobility of a TFT device according to In content in a target according to an embodiment.
Figure 4:
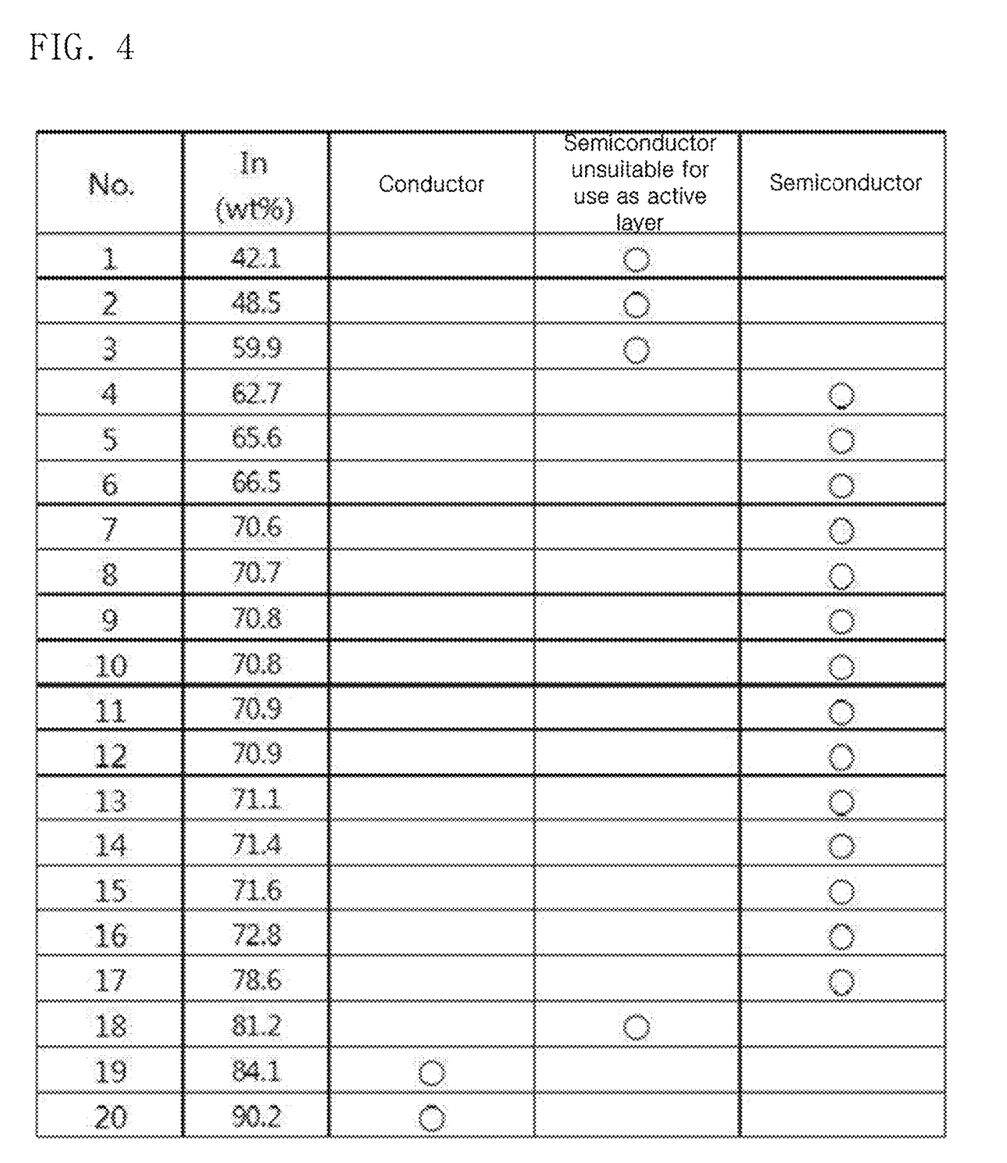
FIG. 4 illustrates a result of the classification of characteristics of the TFT in FIG. 3.

FIG. 3 is a graph illustrating electron mobility of a TFT device according to In content in a target according to an embodiment, and FIG. 4 illustrates a result of the classification of characteristics of the TFT in FIG. 3. In addition, FIG. 5 illustrates changes in Id according to Vg in a TFT including a conductor thin film, a TFT including a semiconducting thin film unsuitable for use as an active layer of a TFT due to inferior characteristics thereof, a TFT including a semiconductor thin film having superior characteristics.

Figure 5:
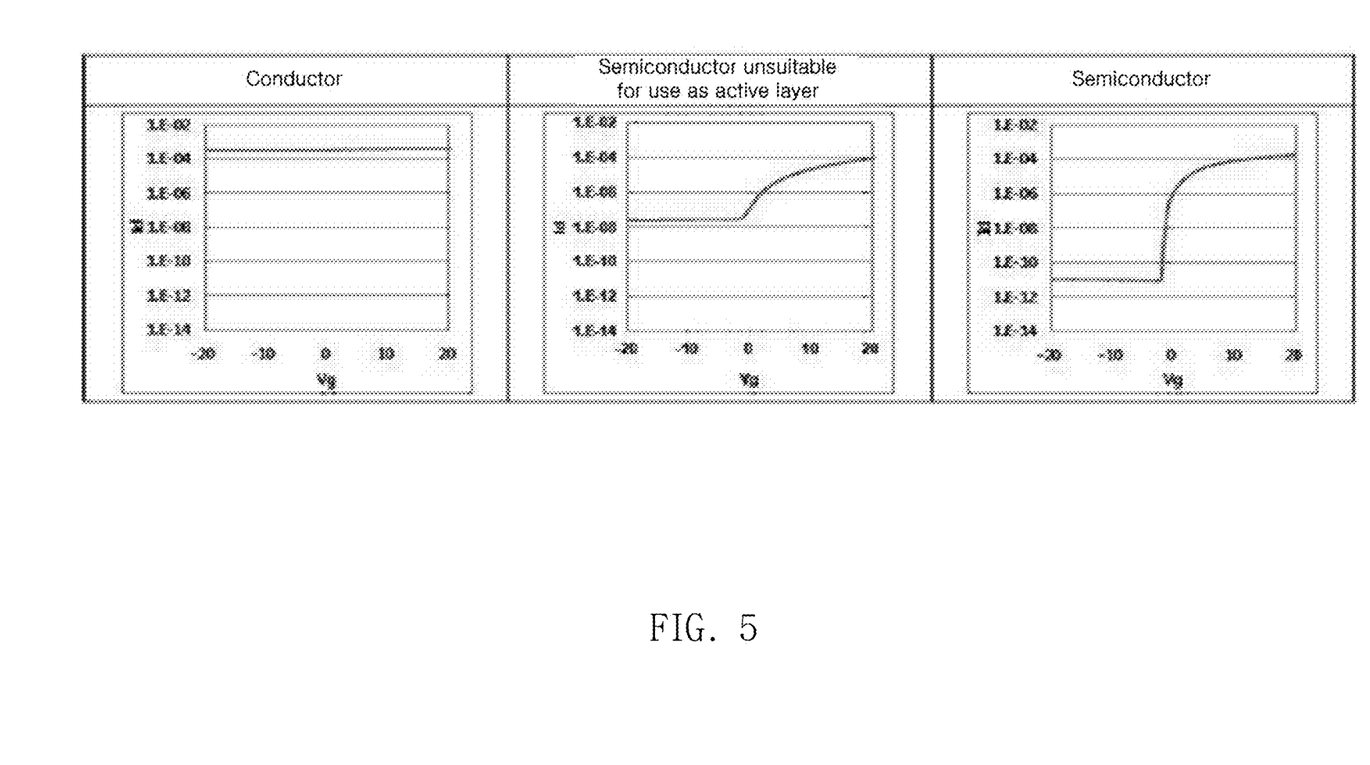
FIG. 5 illustrates changes in Id according to Vg in a TFT including a conductor thin film, a TFT including a semiconducting thin film unsuitable for use as an active layer of a TFT due to inferior characteristics thereof, a TFT including a semiconductor thin film having superior characteristics.

As illustrated in FIGS. 3 to 5, a thin film deposited using a target having In content less than 60% by weight is semiconducting but unsuitable for use as an active layer of a TFT due to inferior characteristics thereof. In addition, a thin film deposited using a target having In content exceeding 80% by weight has low electron mobility or is conductive and thus cannot be used as an active layer of a TFT. In contrast, a thin film deposited using a target having In content of 60% to 80% by weight has superior electron mobility. From this, it can be appreciated that the In content of a target for forming the active layer according to an embodiment is in the range of 60% to 80% by weight. The thin film according to an embodiment may have an electron mobility value of at least 30 cm2/Vs.

When the active layer is conductive, high drain current is measured from the TFT irrespective of the gate voltage, and thus, the TFT cannot realize semiconductor device characteristics of performing on-off switching with respect to the threshold voltage.

In a TFT in which a thin film unsuitable for use as semiconductor is used as the active layer, the drain current changes according to the gate voltage but the difference thereof is not significant, and high leakage current occurs when the gate voltage is equal to or lower than the threshold voltage. Thus, this TFT has inferior performance as a switching device. Meanwhile, a TFT using a thin film having superior semiconductor characteristics has significant changes in drain current according to the gate voltage, and thus has superior performance as a switching device.

Figure 6:
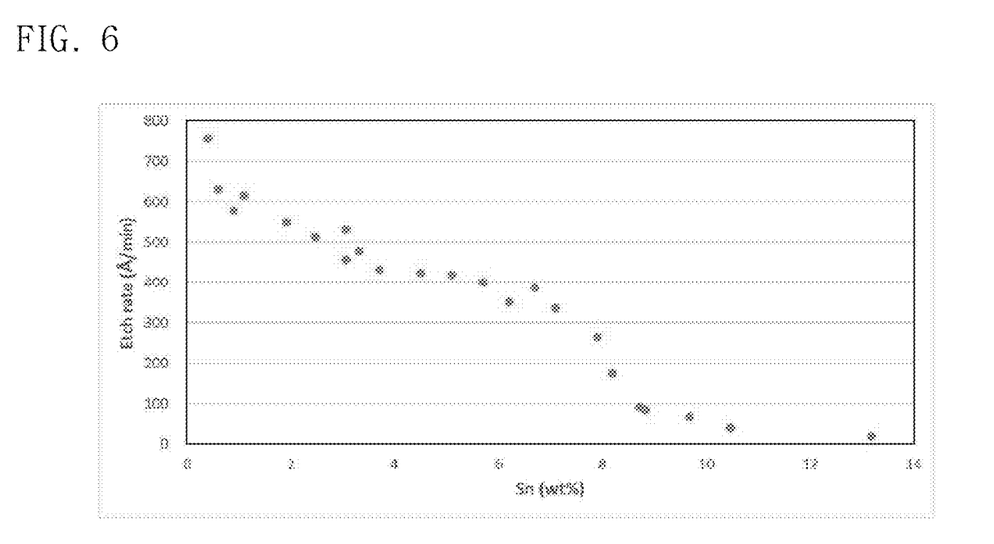
FIG. 6 is a graph illustrating the etching rate of thin films according to Sn content.

FIG. 6 is a graph illustrating the etching rate of thin films according to Sn content of a target according to an embodiment.

As illustrated in FIG. 6, it can be appreciated that, when Sn content of a target exceeds 8% by weight with respect to the weight of In+Sn+Ga+Zn, the etching rate of a thin film formed using the target is significantly reduced.

The TFT is fabricated using a photolithography process, in which an active layer is required to be patterned in a predetermined shape by wet etching after being deposited. For the wet etching, an etching rate equal to or higher than a predetermined rate is required. Particularly, an etching rate equal to or higher than 200 Å/min is required.

Figure 7:
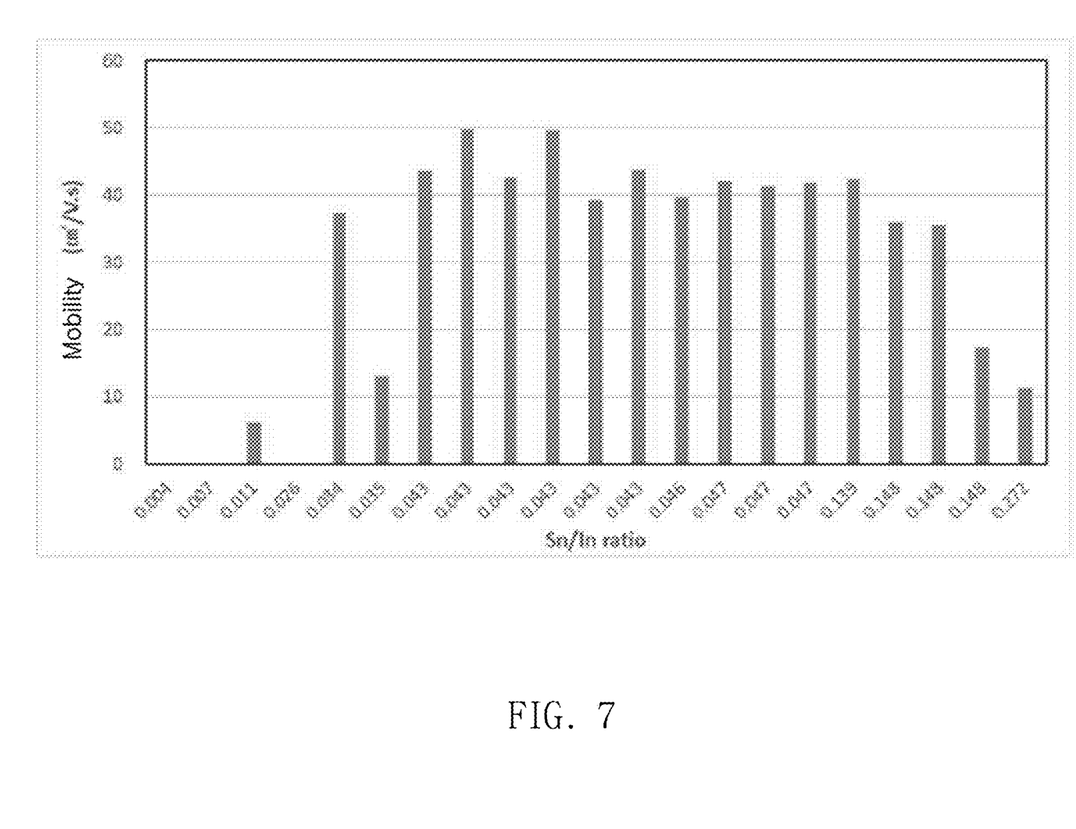
FIG. 7 is a graph illustrating electron mobility of TFT devices according to Sn content with respect to In content of targets.

FIG. 7 is a graph illustrating electron mobility of TFT devices according to Sn content with respect to In content of targets.

As illustrated in FIG. 7, when the content ratio (e.g., weight ratio) of Sn with respect to In of the target is in the range of 0.03 to 0.15 (i.e., the ratio of In to Sn by weight=1: 0.03 to 0.15), a thin film formed using the target has superior electron mobility. Accordingly, it can be appreciated that the content ratio of Sn with respect to In of the target for forming the active layer according to an embodiment is preferably in the range of 0.03 to 0.15.

Figure 8:
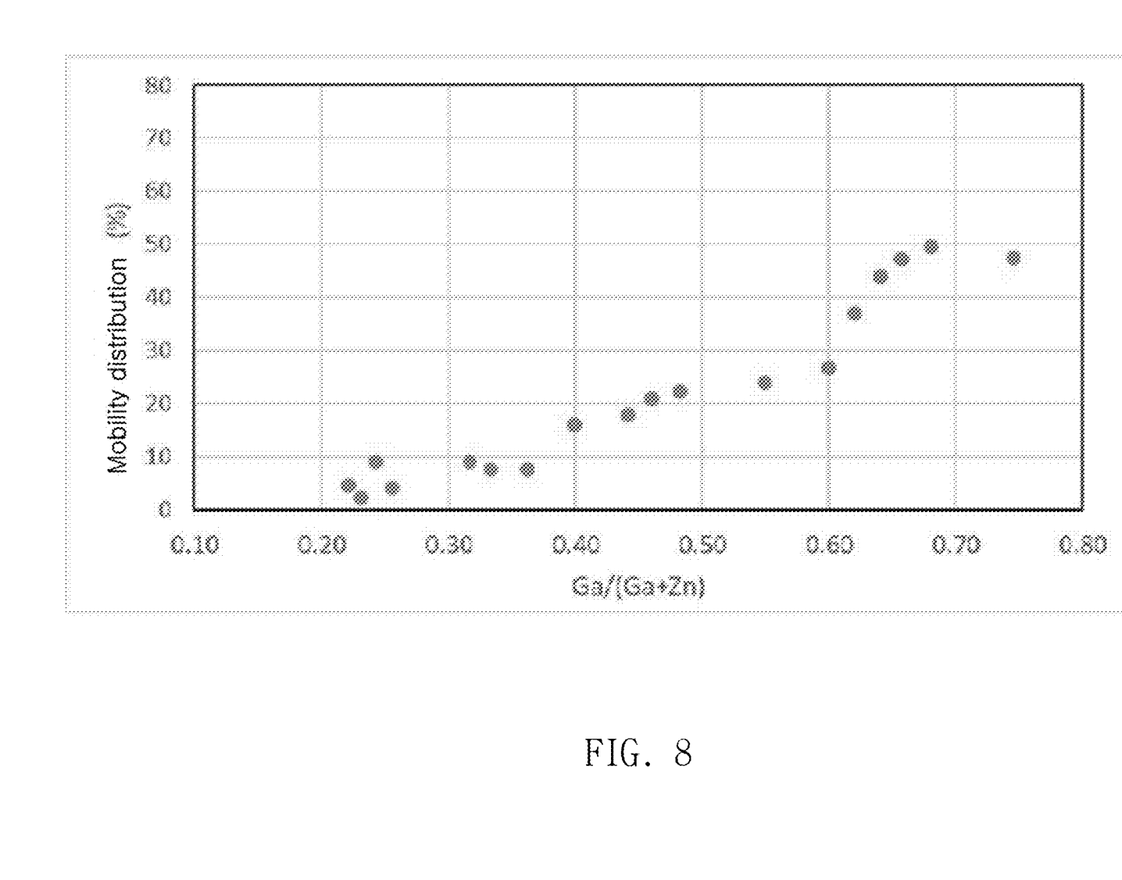
FIG. 8 is a graph illustrating mobility distribution of TFT devices according to a content ratio of Ga with respect to Ga and Zn.

FIG. 8 is a graph illustrating mobility distribution of TFT devices according to the content ratio of Ga with respect to Ga and Zn.

As illustrated in FIG. 8, when the content ratio (e.g., weight ratio) of Ga with respect to Ga and Zn of the target is equal to or lower than 0.6, a thin film formed using the target has superior mobility distribution. Accordingly, it can be appreciated that the content ratio of Ga with respect to Ga and Zn of the target is preferably 0.6 or lower.

The mobility distribution according to the present disclosure refers to mobility differences in TFT devices fabricated by depositing active layers and then heat-treating thin films at 200° C. and 400° C. Preferably, the mobility distribution is 30% or less.

The target having the composition and the content ratio described above may be fabricated by mixing Ga oxide powder, Sn oxide powder, Zn oxide powder, and In oxide powder at the above-described content ratios, shaping the mixture by a shaping method, such as cold pressing, slip casting, filter pressing, cold isostatic pressing, gel casting, centrifugal sedimentation, or gravimetric sedimentation, and then sintering the shaped mixture. The target fabricated in this manner may be used in a sputtering process, while being bonded to and supported by a backing plate formed from, for example, a metal material.

In addition, the TFT 100 including the active layer 130 deposited using the oxide semiconductor target according to embodiments is used as a switching device or a current driving device of a liquid crystal display (LCD) or an organic electroluminescence display. The TFT 100 includes a gate electrode 110, a gate insulation film 120, the active layer 130, a source electrode 140, and a drain electrode 150.

Meanwhile, a substrate 10 may be formed from glass, a semiconductor wafer, a metal oxide, a ceramic material, plastic, or the like that can meet thermodynamic and mechanical requirements for the TFT 100. In particular, the substrate 10 may be formed from glass or plastic, but is not limited thereto.

The gate electrode 110 is formed on the substrate 10. When the substrate 10 is used in a display device, the gate electrode 110 is branched from a gate line (not illustrated) formed on the substrate 10 in a first direction, e.g., a horizontal direction. A voltage for turning the TFT 100 on/off is applied to the gate electrode 110. In this regard, the gate electrode 110 may be formed from a conductive material, such as a metal or a metal oxide. For example, the gate electrode 110 may be formed from a metal, such as Pt, Ru, Au, Ag, Mo, Al, W, or Cu, or a conductive oxide, such as indium zinc oxide (IZO) or indium tin oxide (ITO). That is, the gate electrode 110 is formed by depositing a thin film of such a conductive material on the substrate 10 and then patterning the thin film. Here, the gate electrode 110 may be formed simultaneously with the gate line (not illustrated) by a single process.

The gate electrode 110 may have a structure comprised of a diffusion barrier film (not illustrated) and a Cu film deposited on the diffusion barrier film (not illustrated). The diffusion barrier film (not illustrated) is configured to prevent Cu atoms from diffusing into the substrate 10 and thereby improve bonding force and electrical properties of Cu. The diffusion barrier film (not illustrated) may be implemented by containing at least one of Ti, Ta, Mo, Cr, Ni, Pt, and the like.

The gate insulation film 120 may be formed from an insulation material used in a typical semiconductor device. In particular, the gate insulation film 120 may be formed from a Si oxide or a Si nitride. For example, the gate insulation film 120 may be formed from at least one of high-K materials, such as $HfO_2$, $Al_2O_3$, and $Si_3N_4$, and mixtures thereof, wherein the dielectric constant of each of the high-K materials is higher than that of $SiO_2$ or $SiO_2$.

The active layer 130 is formed on the gate insulation film 120 corresponding to the gate electrode 110, and has a channel area CH.

In addition, in some embodiments, the active layer 130 is deposited on the gate insulation film 120 by a sputtering process using the above-described oxide semiconductor sputtering target according to embodiments, in which the In, Sn, Ga, and Zn contents are in the range of 60% to 80%, 0.5% to 8%, 5% to 15%, and 10% to 30% by weight with respect to the weight of In+Sn+Ga+Zn, respectively, and then patterning the deposited layer.

Since the electron mobility and reliability of the active layer 130 may be superior to those of the related-art active layer formed from the quaternary semiconductor material based on a composition of In, Ga, Zn, and O and implemented as a thin film having the above-described composition and content ratios, the performance of the TFT 100 including the active layer 130 can be improved.

The source electrode 140 and the drain electrode 150 are disposed on the active layer 130 while being spaced apart from each other. Each of the source electrode 140 and the drain electrode 150 may be formed from a conductive material, such as a metal, and may have a structure comprised of a diffusion barrier film (not illustrated) and a Cu film deposited on the diffusion barrier film (not illustrated) like the gate electrode 110.

The source electrode 140 is connected to a data line (not illustrated) arranged on the substrate 10 in a second direction (e.g., a vertical direction) perpendicularly intersecting the gate line (not illustrated). In addition, the drain electrode 150 is connected to a pixel electrode (not illustrated).

Meanwhile, an Ohmic contact layer 135 that is an impurity semiconductor layer may be formed between the active layer 130 and the source and drain electrodes 140 and 150.

In addition, although not illustrated in FIG. 1, the TFT may further include a passivation layer (not illustrated) formed on top of the source and drains electrodes, and the like. The passivation layer may be formed from one of $SiO_2$, $SiN_x$, and other oxides.

The above-described TFT 100 according to embodiments is used as a switching device or a current driving device of a variety of display devices. For example, although not illustrated, when the TFT 100 is used in an LCD including upper and lower substrates facing each other, a liquid crystal layer sandwiched between the upper and lower substrates, and a backlight below the lower substrate to emit light forwardly, the TFT 100 is disposed on the lower substrate on which a plurality of gate lines and a plurality of data lines are arranged, in particular, in a pixel area defined by intersection of the plurality of gate lines and the plurality of data lines. Here, a color filter is provided on the upper substrate corresponding to the pixel area. In addition, an optical film may be disposed on the top surface of the upper substrate to supplement optical properties of the LCD.

The TFT 100 according to embodiments may also be used in an organic light-emitting display device as well as the LCD. In this case, the TFT 100 is formed in a pixel area defined by intersection of a plurality of gate lines and a plurality of data lines arranged on the lower surface. Here, organic light-emitting elements are formed on the lower surface. The lower substrate and the upper substrate are bonded together, thereby forming an organic light-emitting panel of the organic light-emitting display device. Here, each of the organic light-emitting element includes an anode and a cathode, as well as a hole transporting layer, an emission layer, and an electron transporting layer positioned between the anode and the cathode. Here, a hole injection layer and an electron injection layer may be provided between the anode and the hole transporting layer and between the electron transporting layer and the cathode, respectively, in order to more efficiently inject holes and electrons. Thus, holes injected into the emission layer through the hole injection layer and the hole transporting layer from the anode and electrons injected into the emission layer through the electron injection layer and the electron transporting layer from the cathode together form excitons, each of which generates light matching the energy gap between a hole and an electron. Here, the anode may be formed from a transparent material having a high work function, such as indium tin oxide (ITO) or indium zinc oxide (IZO), and the cathode may be formed from a chemically stable material having a low work function, such as Al, Ca, or an Al alloy.

In addition, an optical film may be disposed on the upper surface of the organic light-emitting display device to supplement optical properties of the OLED display device.

The foregoing descriptions of specific exemplary embodiments of the present disclosure have been presented with respect to the drawings and are not intended to be exhaustive or to limit the present disclosure to the precise forms disclosed herein, and many modifications and variations would obviously be possible for a person having ordinary skill in the art in light of the above teachings.

It is intended, therefore, that the scope of the present disclosure not be limited to the foregoing embodiments, but be defined by the Claims appended hereto and their equivalents.

What is claimed is:

1. An oxide semiconductor sputtering target used in a sputtering process to deposit an active layer of a thin-film transistor, comprising:
   a material based on a composition of In, Sn, Ga, Zn, and O,
   wherein the material comprises gallium oxide, tin oxide, zinc oxide, and indium oxide, wherein In, Sn, Ga, and Zn contents are in ranges of 60% to 80%, 0.5% to 8%, 5% to 15%, and 10% to 30% by weight with respect to the weight of In+Sn+Ga+Zn, respectively.

2. The oxide semiconductor sputtering target of claim 1, wherein the In, Sn, Ga, and Zn contents are in ranges of 65% to 75%, 1% to 5%, 7% to 13%, and 10% to 20% by weight with respect to the weight of In+Sn+Ga+Zn, respectively.

3. The oxide semiconductor sputtering target of claim 1, wherein a weight ratio of Sn with respect to In is in a range of 0.03 to 0.15.

4. The oxide semiconductor sputtering target of claim 1, wherein a total of the Ga and Zn contents is in a range of 20% to 40% by weight with respect to the weight of In+Sn+Ga+Zn.

5. The oxide semiconductor sputtering target of claim 1, wherein a weight ratio of Ga with respect to Ga+Zn is 0.6 or less.

6. A method of fabricating a thin-film transistor, the method comprising depositing an active layer using the oxide semiconductor sputtering target of claim 1.

7. The method of claim 6, further comprising heat-treating the active layer at a temperature in a range of 200° ° C. to 400° ° C. after depositing the active layer.

8. The method of claim 6, wherein the thin-film transistor is provided in a liquid crystal display device or an organic light-emitting display device.

9. The method of claim 6, wherein the In, Sn, Ga, and Zn contents are in ranges of 65% to 75%, 1% to 5%, 7% to 13%, and 10% to 20% by weight with respect to the weight of In+Sn+Ga+Zn, respectively.

10. The method of claim 6, wherein a weight ratio of Sn with respect to In is in a range of 0.03 to 0.15.

11. The method of claim 6, wherein a total of the Ga and Zn contents is in a range of 20% to 40% by weight with respect to the weight of In+Sn+Ga+Zn.

12. The method of claim 6, wherein a weight ratio of Ga with respect to Ga+Zn is 0.6 or less.

* * * * *